(12) United States Patent
Fourie et al.

(10) Patent No.: US 9,477,364 B2
(45) Date of Patent: Oct. 25, 2016

(54) DEVICE HAVING MULTI-LAYERED TOUCH SENSITIVE SURFACE

(71) Applicant: GOOGLE INC., Mountain View, CA (US)

(72) Inventors: Daniel Fourie, San Mateo, CA (US); Amy Lai Wong, San Francisco, CA (US); Ken Foo, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/535,631

(22) Filed: Nov. 7, 2014

(65) Prior Publication Data

US 2016/0132145 A1 May 12, 2016

(51) Int. Cl.
| | |
|---|---|
| *G06F 3/044* | (2006.01) |
| *G06F 3/045* | (2006.01) |
| *G09G 3/34* | (2006.01) |
| *H03K 17/96* | (2006.01) |

(52) U.S. Cl.
CPC ............ *G06F 3/044* (2013.01); *G06F 3/045* (2013.01); *G09G 3/3406* (2013.01); *H03K 17/96* (2013.01); *G06F 2203/04106* (2013.01)

(58) Field of Classification Search
None
See application file for complete search history.

(56) References Cited

U.S. PATENT DOCUMENTS

| | | | |
|---|---|---|---|
| 8,179,376 B2 | 5/2012 | Griffin | |
| 8,619,034 B2 | 12/2013 | Grad | |
| 2004/0004596 A1* | 1/2004 | Kang .................. | G09G 3/3406 345/102 |
| 2007/0126714 A1* | 6/2007 | Imamura ............. | G06F 3/03547 345/173 |
| 2008/0204418 A1 | 8/2008 | Cybart et al. | |
| 2009/0091541 A1 | 4/2009 | Chen | |
| 2009/0251422 A1 | 10/2009 | Wu et al. | |
| 2010/0177035 A1 | 7/2010 | Schowengerdt et al. | |
| 2011/0080349 A1 | 4/2011 | Holbein et al. | |
| 2011/0175826 A1* | 7/2011 | Moore ................ | G06F 3/04886 345/173 |
| 2012/0206401 A1* | 8/2012 | Lin ........................ | G06F 3/044 345/174 |
| 2012/0260207 A1 | 10/2012 | Treskunov et al. | |
| 2012/0307520 A1* | 12/2012 | Chen .................... | G02B 6/0061 362/606 |
| 2012/0307521 A1* | 12/2012 | Chen .................... | G06F 3/0418 362/606 |
| 2013/0076635 A1* | 3/2013 | Lin ....................... | G06F 1/1662 345/169 |
| 2013/0169540 A1 | 7/2013 | Dinh | |
| 2013/0265275 A1 | 10/2013 | Liao et al. | |
| 2014/0028567 A1 | 1/2014 | Park et al. | |
| 2014/0168083 A1 | 6/2014 | Ellard | |
| 2014/0267130 A1* | 9/2014 | Hwang ............... | G06F 3/04883 345/174 |

FOREIGN PATENT DOCUMENTS

| | | |
|---|---|---|
| WO | 2012/118803 A1 | 9/2012 |
| WO | 2013010154 A3 | 3/2013 |
| WO | 2016/073133 A1 | 5/2016 |

OTHER PUBLICATIONS

International Search Report and Written Opinion received for PCT Patent Application No. PCT/US2015/054658, mailed on Jan. 26, 2016, 15 pages.

* cited by examiner

*Primary Examiner* — Seokyun Moon
(74) *Attorney, Agent, or Firm* — Brake Hughes Bellermann LLP

(57) ABSTRACT

A touchscreen display device may include a capacitive sensor disposed adjacent to a top surface of the display device, and a resistive sensor disposed below the capacitive sensor. A backlight may selectively illuminate a pattern on an inner side of the top surface of the display device, so that the pattern is visible from outside the display device when the backlight is activated, and is not visible when the back light is not activated.

17 Claims, 15 Drawing Sheets

DEVICE HAVING MULTI-LAYERED TOUCH SENSITIVE SURFACE

TECHNICAL FIELD

This relates, generally, to a touch surface having capacitive and resistive sensors.

BACKGROUND

Touchscreens may be used with a variety of computing devices to facilitate user interaction with the computing device through, for example, a graphical user interface (GUI), displayed on the touchscreen. Sensors may sense user interaction with a sensing surface of the touchscreen to detect position and/or motion of a pointing device at the sensing surface and correlate the sensed interaction with an item displayed on the touchscreen.

SUMMARY

In one aspect, a method of operating a touchscreen device, in accordance with embodiments broadly described herein, may include detecting a first user interaction with a predetermined portion of a touch surface, in response to the first user interaction, activating a backlight and directing light generated by the backlight toward a cover layer of the device forming the touch surface, detecting a second user interaction with the touch surface, the second user interaction including an actuation force applied to the touch surface that is sensed by a resistive sensor, and processing an input corresponding to the second user interaction, and de-activating the backlight such that light is not directed toward the predetermined portion of the touch surface.

In another aspect, a touch sensitive display device, in accordance with embodiments broadly described herein, may include a cover layer including a touch sensitive surface, at least one sensor disposed below an interior side surface of the cover layer, a pattern defined on the interior side surface of the cover layer, a backlight, and a controller configured to control the backlight in response to a user interaction sensed by the at least one sensor at the touch sensitive surface, wherein the pattern includes translucent portions and opaque portions, the translucent portions transmitting light generated by the backlight and the opaque portions blocking light generated by the backlight.

The details of one or more implementations are set forth in the accompanying drawings and the description below. Other features will be apparent from the description and drawings, and from the claims.

DETAILED DESCRIPTION

Computing devices, including, for example, laptop computers, notebook computers, tablet devices, smart phone devices, and other such devices, may include a touchscreen, or a touchscreen display device, or a touch sensitive display device, to facilitate user interaction with the computing device. Such touchscreen display devices may be configured to, together with other components of the computing device, render a graphical user interface (GUI) that allows a user to interact with the computing device and make selections from elements displayed on the touchscreen display device based on contact with the touchscreen display device itself, without requiring use of a separate input device such as a mouse or keyboard. A user of the computing device may interact with the computing device via the GUI rendered on the touchscreen display device by directly touching and/or moving the touch along the touchscreen display device, to for example, to move a cursor, select objects, launch programs from icons, move objects displayed in the GUI, and the like. A keyboard displayed on this type of touchscreen display device, particularly a keyboard which facilitates rapid and accurate entry of inputs by the user, may further enhance functionality and utility. In use, embodiments described herein may provide components which enable, for example, a touchscreen display device to display a keyboard pattern as a user's hand/finger(s) approach the screen, and enables the keyboard to virtually disappear, with little to no residual shadowing in response to a command or action which causes the keyboard to disappear.

Figure 1:
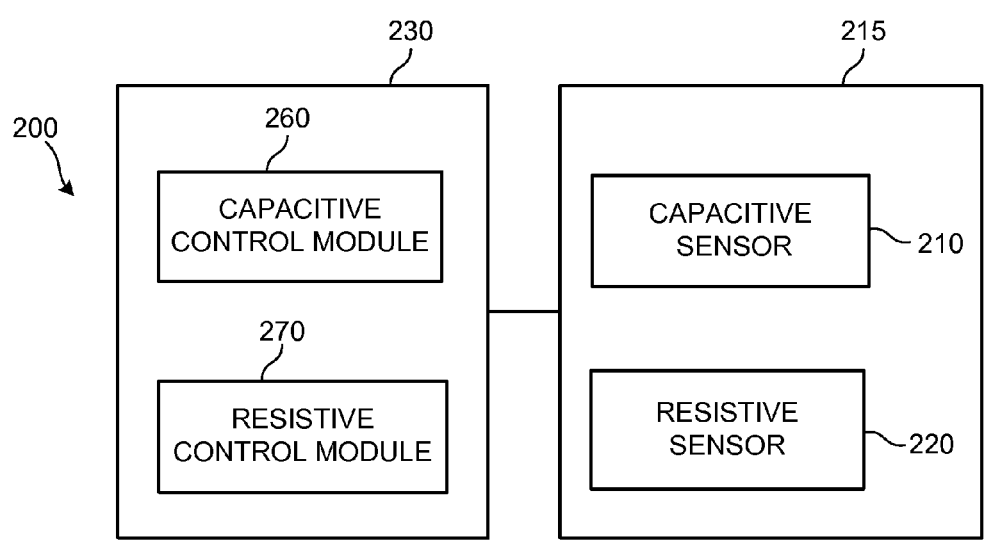
FIG. 1 is a block diagram of a touchscreen display device, in accordance with an embodiment as broadly described herein.
Figure 5A:
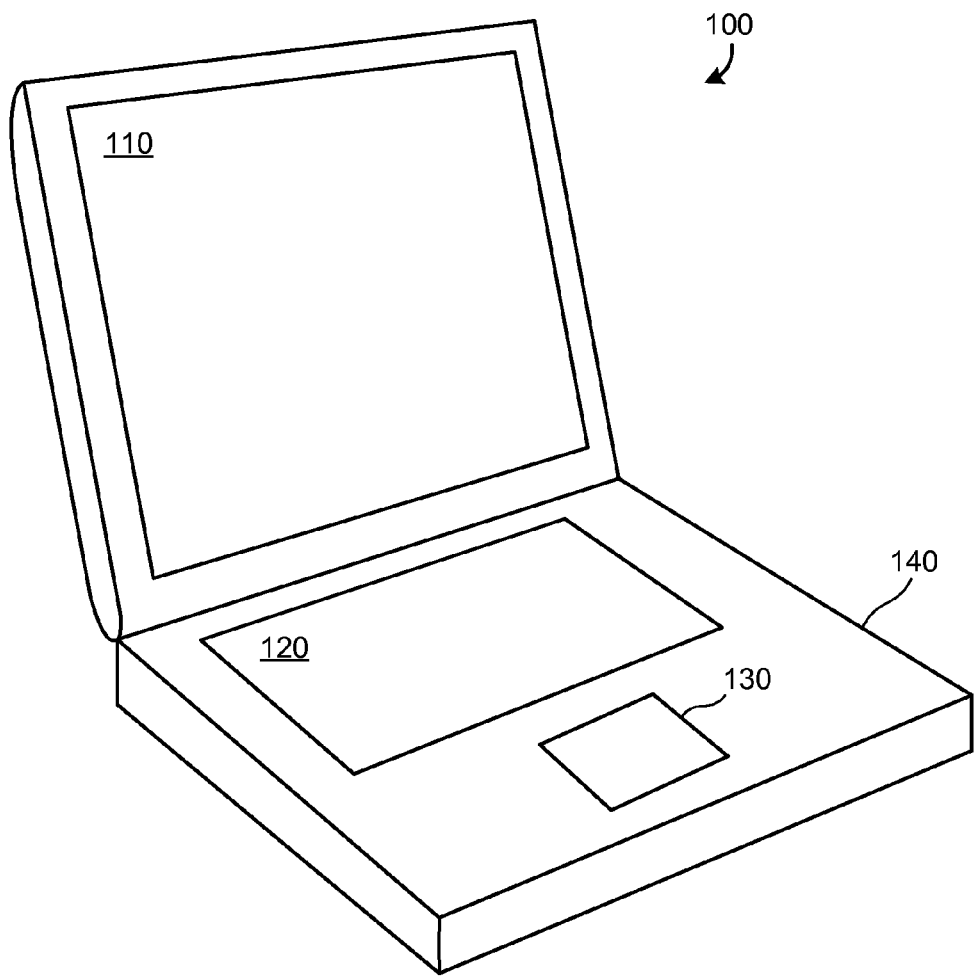
FIGS. 5A-5C illustrate example computing devices, in accordance with example implementations.
Figure 5B:
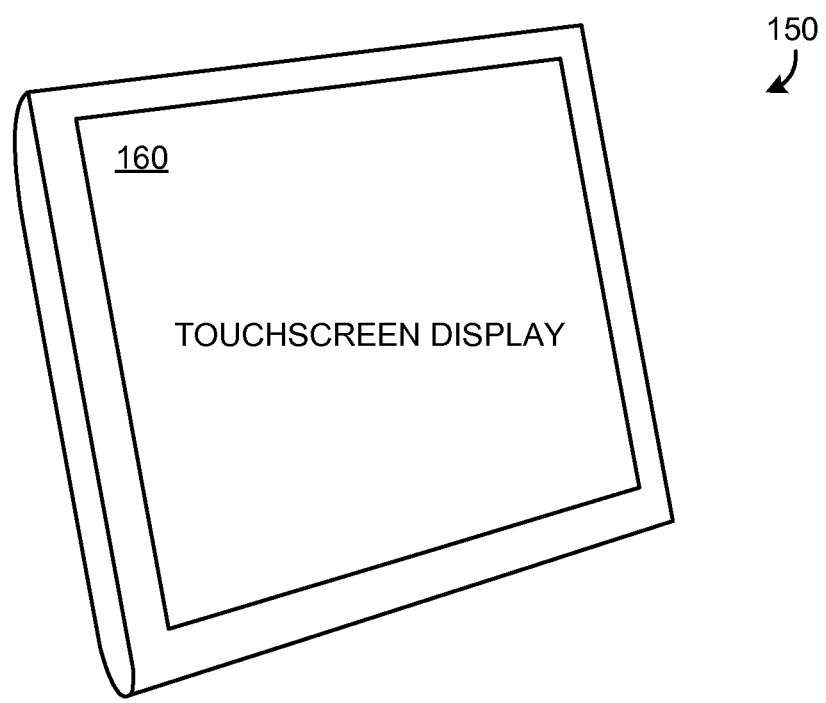
Figure 5C:
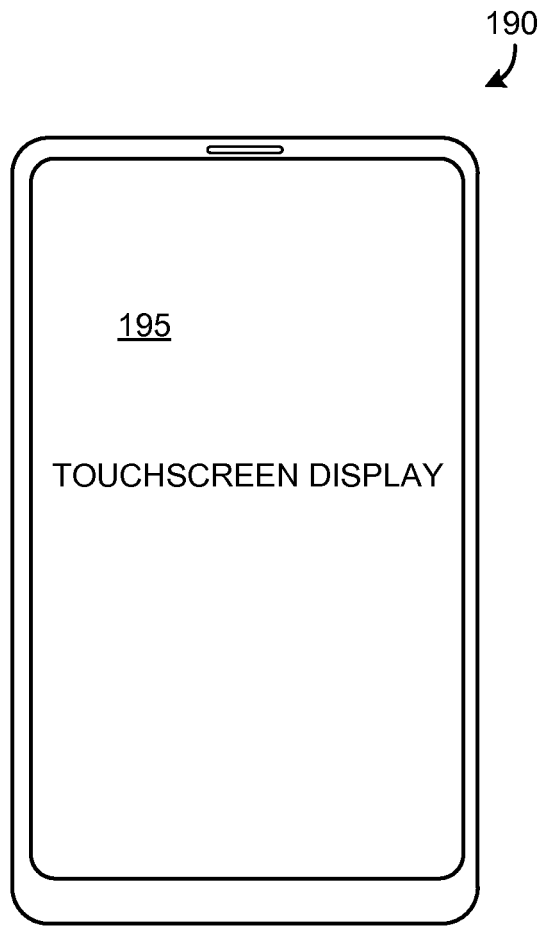

FIG. 1 is a block diagram illustrating an overview of components of a touchscreen display device, in accordance with an embodiment as broadly described herein. The example touchscreen display device 200 shown in FIG. 1 may be implemented, for example, in a computing device 100 as shown in FIG. 5A, in a computing device 150 as shown in FIG. 5B, in a computing device 190 as shown in FIG. 5C, or other implementations of the touchscreen display device 200 with other computing devices not specifically detailed herein as appropriate.

The touchscreen display device 200 may include a sensing device 215 sensing a touch input at or near a touch sensitive surface of the touchscreen display device 200. A controller 230 may be operatively coupled to the sensing device 215. The controller 230 may receive inputs sensed by the sensing device 215 at the touch sensitive surface of the touchscreen display device 200, and process the received inputs. In some embodiments, the sensing device 215 may also sense a pressure input applied at the touch sensitive surface of the touchscreen display device 200. Thus, in some embodiments, the sensing device 215 may include, for example, a capacitive sensor 210 to sense a user interaction on or in close proximity to a touch sensitive input surface of the touchscreen display device 200, and a resistive sensor 220 to sense a pressure input applied at the touch sensitive surface of the touchscreen display device 200. While the touchscreen display device 200 shown in FIG. 1 includes both the capacitive sensor 210 and the resistive sensor 220, it will be understood that a touchscreen display device as embodied and broadly described herein may include both the capacitive sensor 210 and the resistive sensor 220, or only the capacitive sensor 210, or only the resistive sensor 220, as dictated by a particular implementation of the touchscreen display device 200.

In an embodiment including a capacitive sensor 210, the capacitive sensor 210 may include a sensing surface for detecting the presence and/or movement of one or more electrically conductive and electrically grounded objects, such as a user's finger or fingers, for example. In an example implementation, the capacitive sensor 210 may be implemented using, for example, a single layer capacitive sensor or a multi-layer array of capacitors, and thus may also be referred to hereinafter as a capacitive layer 210. When an electrically grounded object, such as a user's finger or fingers, is detected by the sensing surface of the capacitive sensor 210, capacitance in the area or areas with which the electrically grounded objects or objects are in (electrical) contact with the capacitive sensor 210 change. The controller 230, in conjunction with the capacitive sensor 210, may detect the position or positions of a user's finger or fingers on the capacitive sensor 210 and/or movement of a user's finger or fingers across the capacitive sensor 210 based on the detection of these changes in capacitance, and changes in location of the changes in capacitance, and correlate these changes with a touch or touch and drag input. In some embodiments, the capacitive sensor 210 may also be configured to detect the proximity of such an electrically grounded pointing implement. That is, the capacitive sensor 210 may be configured to detect the conductive pointing implement, for example, the user's finger, in close proximity to (within a detection range or zone of) the sensing surface of the touchscreen display device.

In an embodiment including a resistive sensor 220, the resistive sensor 220 may be disposed below the capacitive sensor 210, and may include a single multi-layer array of resistive elements, and thus may also be referred to hereinafter as a resistive layer 220. Pressure applied at one or more locations on the touch sensitive surface of the touchscreen display device 200 may be transferred to the resistive sensor 220 and sensed by the resistive sensor 220 as a corresponding input. In some embodiments, this transfer of pressure applied at the touch sensitive surface may cause displacement of the resistive sensor 220 at corresponding locations of the resistive sensor 220. This location specific sensing and/or displacement of the resistive sensor 220 may result in corresponding location specific changes in voltage in the resistive sensor 220. These location specification changes in voltage corresponding with the location or locations at which pressure is applied may be detected and correlated to an element rendered in the GUI by the controller 230.

In an embodiment including both a capacitive sensor 210 and a resistive sensor 220, the controller 230 may include a capacitive controller module 260 and a resistive controller module 270 to provide for rapid coordination, synchronization, processing and response to inputs sensed at the capacitive sensor 210 and the resistive sensor 220. In some embodiments, the capacitive controller module 260 and the resistive controller module 270 may work in conjunction to determine a location of a capacitive touch detected at the capacitive sensor 210 combined with an actuation at the determined location detected based on a force or pressure detected by the resistive sensor 220.

Figure 2A:
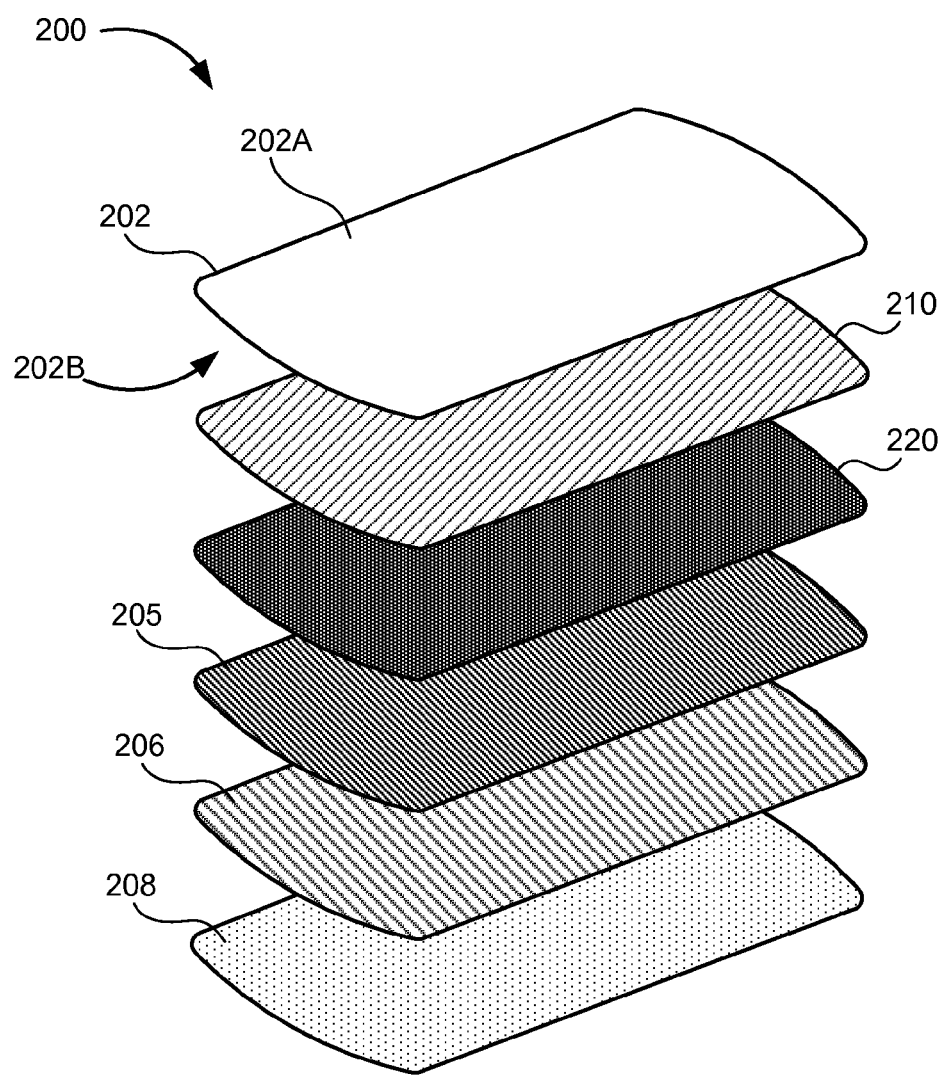
FIG. 2A is an exploded perspective view of a touchscreen display device, in accordance with an example embodiment.
Figure 2B:
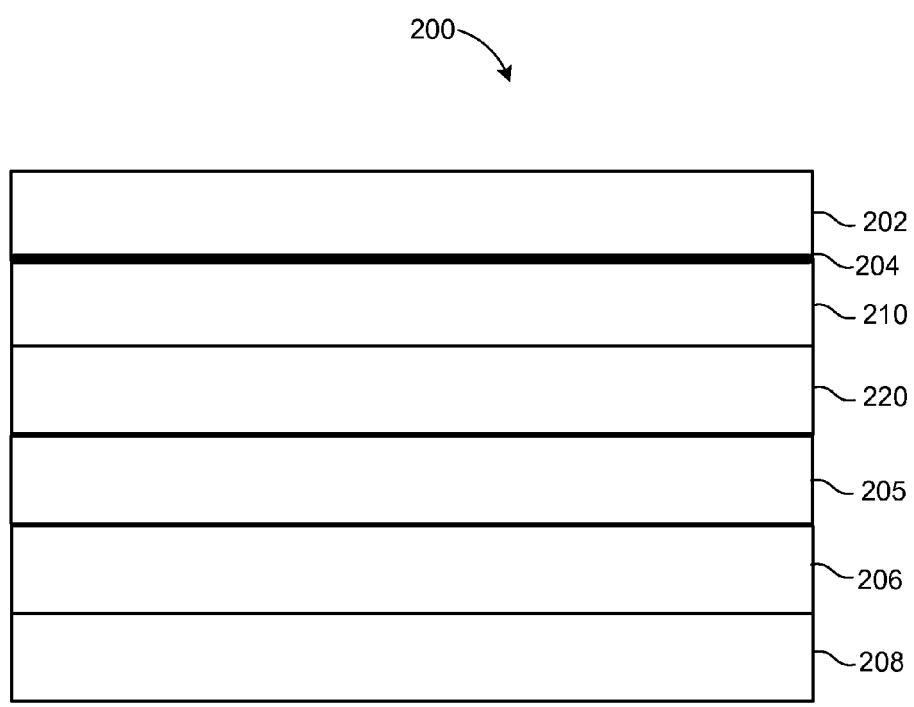
FIGS. 2B and 2C are side sectional views of touchscreen display devices, in accordance with example embodiments.

An example arrangement of a touchscreen display device 200, in accordance with one example embodiment, is shown in the exploded perspective view of FIG. 2A, and in the side sectional view of FIG. 2B. It is understood that this example arrangement may be applied to any one of the computing devices 100, 150 and 190 shown in FIGS. 5A-5C, respectively. It is also understood that the touchscreen display device 200 may include only some of the components shown in FIGS. 2A-2B, all of the components shown in FIGS. 2A-2B, and/or other components in addition to those shown in FIGS. 2A-2B, depending on a particular implementation, and that arrangement of the respective components may vary based on a particular implementation.

As shown in FIG. 2A, in one embodiment, the touchscreen display device 200 may include a cover layer 202 having a front, or outward facing side surface 202a exposed to the user to provide a touch sensitive input surface for user interaction with the device 200, and a rear, or interior facing, side surface 202b. In some embodiments a pattern 204 may be printed, or otherwise defined, on the interior facing surface 202b of the cover layer 202, and may be selectively illuminated and displayed to the user in response to a corresponding input. By printing this pattern 204 on the interior facing side surface 202b of the cover layer 202, the touch sensitive input surface formed by the exterior facing side 202a of the cover layer 202 may remain substantially smooth, allowing the user's touch and/or drag input on the touch surface to be unimpeded by any printing, while protecting the printing on the interior facing side 202b of the cover layer 202 from excessive or undesirable wear. In the example embodiment shown in FIG. 2A, simply for ease of discussion and illustration, each of the layers of the touchscreen display device 200 has essentially the same area. However, in other embodiments, depending on a particular implementation, these layers may have different areas to accommodate other components and/or display areas.

The capacitive layer 210 may be positioned between the cover layer 202 and the resistive layer 220. As described above, the capacitive layer 210 may include a single or multi-layered capacitive sensor structure to detect an electrically grounded object, such as a user's finger(s) or hand, near the exterior facing side surface 202a of the cover layer 202, or touching the exterior facing side surface 202a of the cover layer 202. Positioning of the capacitive layer 210 just below the cover layer 202 as shown may allow the capacitive layer 210 to detect not just a touch to the touch sensitive surface, but to also detect a finger or hand approaching the touch sensitive input surface and/or hovering just above the touch sensitive input surface.

As shown in the example embodiment of FIG. 2A, the resistive layer 220 may be positioned below the capacitive sensor 210. As described above, the resistive layer 220 may include a single or multi-layered resistive sensor structure to detect pressure applied at one or more locations on the touch sensitive input surface.

A light guide layer 205 may be positioned under the resistive sensor 220. A backlight 207 may be operably coupled with the light guide layer 205. When arranged in this manner, the light guide layer 205 may guide light generated by the backlight 207 toward the cover layer 202, via the resistive layer 220 and the capacitive layer 210, to selectively illuminate the pattern 204 printed on the interior facing side surface 202b of the cover layer 202 when the backlight 207 is activated. In some embodiments, the backlight 207 may be positioned at a lateral side of the light guide layer 205. In other embodiments, the backlight 207 may be positioned along or integrated with the light guide layer 205. A reflective layer 206 may be positioned below the light guide layer 205 to reflect light generated by the backlight 207 in the direction of the cover layer 202. These layers may be supported on a substrate 208.

In the example embodiment shown in FIG. 2A, the capacitive layer 210 and the resistive layer 220 may be substantially transparent, allowing light from the backlight 207 and light guide layer 205 to be transmitted through the capacitive layer 210 and the resistive layer 220 to illuminate the pattern 204 (see FIG. 2B) on the cover layer 202. Transparency of the capacitive layer 210 and the resistive layer 220 may allow for an arrangement in which the resistive layer 220 is positioned just below the capacitive layer 210, with the light guide layer 205 below the resistive layer 220. If, for example, the capacitive layer were transparent but the resistive layer were not transparent, the light guide layer 205 would be positioned between the capacitive and resistive layers so that light could be transmitted up through the cover layer without being blocked, or partially blocked, by the non-transparent resistive layer. The positioning of the light guide layer between the capacitive and resistive layers increases the distance from the input surface of the cover layer to the resistive layer, thereby increasing the amount of pressure/force required for detection by the resistive sensor. In contrast, the positioning of the resistive layer 220 relative to the capacitive layer 210 and the light guide layer 205 shown in FIGS. 2A-2C may allow the resistive layer 220 to be actuated by a relatively low target actuation force compared to an arrangement in which the light guide layer 205 is positioned between the capacitive layer 210 and the resistive layer 220.

In the arrangement shown in FIG. 2A, the transmissivity of the capacitive layer 210 and the transmissivity of the resistive layer 220 may be relatively high. Transmissivity of the capacitive layer 210 and the resistive layer 220 will affect the amount of light required from the backlight 207 to illuminate the pattern to an appropriate degree for effective visibility of the pattern 204 when illuminated. That is, as transmissivity of the capacitive layer 210 and/or the resistive layer 220 decreases, i.e., the capacitive layer 210 and/or the resistive layer 220 becomes less transparent/less capable of transmitting light therethrough. Less transmissivity will require a greater amount of light to illuminate the pattern 204 to a desired degree, so that the pattern 204 is properly visible to the user. For example, to achieve a luminance level of 6 nits to the user, so that the pattern 204 may be sufficiently illuminated and visible to the user, a transmissivity of the capacitive layer 210 may be greater than or equal to approximately 80%, a transmissivity of the resistive layer 220 may be greater than or equal to approximately 80%, and luminance of the backlight 207 may be greater than or equal to approximately 220 nits. An adjustment in any one of these values will result in an adjustment to the remaining values to achieve the desired luminance level to the user. In one example embodiment, in which a transmissivity of the resistive layer 220 may be approximately 95%, a transmissivity of the capacitive layer may be approximately 95%, and a transmissivity of the cover layer 202 may be approximately 95%, with overall transmissivity of this stack being approximately 86%, to achieve a 10 nits output to the user, a backlight 207 producing approximately 240 nits may be used.

The luminance level experienced by the user may also be affected by the transmissivity of the cover layer 202, and by the transmissivity of the pattern 204 printed on the interior facing side surface 202b of the cover layer 202.

In the example embodiments presented herein, it will be assumed that the cover layer 202 is substantially transparent, as thin as possible, flexible, and with a smooth exterior facing side surface 202a, with the pattern 204 printed on the interior facing side surface 202b. For example, the cover layer 202 may include a polyurethane film or polymer film, and in some embodiments, may include glass type beads embedded in such a film to retain a smooth, glass-like finish, while also being flexible and scratch resistant. In some embodiments, the transmissivity of a cover layer of this type may be, for example, approximately 92%.

FIG. 2B is a side sectional view of the touchscreen display device 200 shown in FIG. 2A, in accordance with one example embodiment. As noted above, more, or fewer layers, may be included in the various implementations of a touchscreen display device 200 as embodied and broadly described herein. Further, in the example shown in FIG. 2B, the layers are coupled by optically clear adhesive. However, other ways of coupling or attaching the layers may also be appropriate.

As shown in FIG. 2B, the reflector 206 may be disposed on the substrate 208, and attached by, for example, an optically clear adhesive layer 250a. The light guide layer 205 may be disposed on the reflector 206, and attached by, for example, another optically clear adhesive layer 250b. The resistive layer 220 and the capacitive layer 210 may be sequentially disposed on the light guide layer 205, and attached by, for example, another optically clear adhesive layer 250c. In some embodiments, there may be a gap, for example, an air gap, between the resistive layer 220 and the capacitive layer 210, maintained by a filler material or other material as appropriate, provided, for example, along edges between the resistive layer 220 and the capacitive layer 210 and/or along boundaries between adjacent sensing areas of the resistive layer 220 and/or the capacitive layer 210. The cover layer 202 may be disposed on the capacitive layer 210, with the pattern 204 on the interior facing side surface 202b of the cover layer 202 facing the capacitive layer 210. The cover layer 202 may be attached to the capacitive layer 210 by, for example, an optically clear adhesive layer 250d. Transmissivity of the optically clear adhesive layer 250d may be greater than or equal to approximately 97%.

It will be understood that in some embodiments, the touch sensitive display device 200 may include, for example, one or more polarizers or color filters, a display, associated circuitry and the like. For example, a display panel may be positioned adjacent to the capacitive and resistive layers, between the light guide layer and the cover layer, such that only a portion of the exterior facing side surface of the cover layer forms a touch sensitive input surface, the remainder providing a display area for displaying images to the user generated by the display panel. Alternatively, the capacitive and resistive layers may extend across the touchscreen display device, and a display panel may occupy a space adjacent to the light guide, between the reflector and the capacitive/resistive sensors.

Thicknesses of the optically clear adhesive layers 250a, 250b, 250c and 250d, respectively, may vary, based on the particular implementation, the respective thicknesses of the neighboring layers, the overall size of the touch sensitive display device 200, desired output, and other such considerations. Similarly, respective thicknesses of the substrate 208, the reflector 206, the light guide layer 205, the resistive layer 220, the capacitive layer 210 and the cover layer 202 will vary based on, for example, characteristics of the particular material and characteristics of the neighboring adhesive layer(s) and combination of the overall features of the assembled layers and desired output.

Figure 2C:
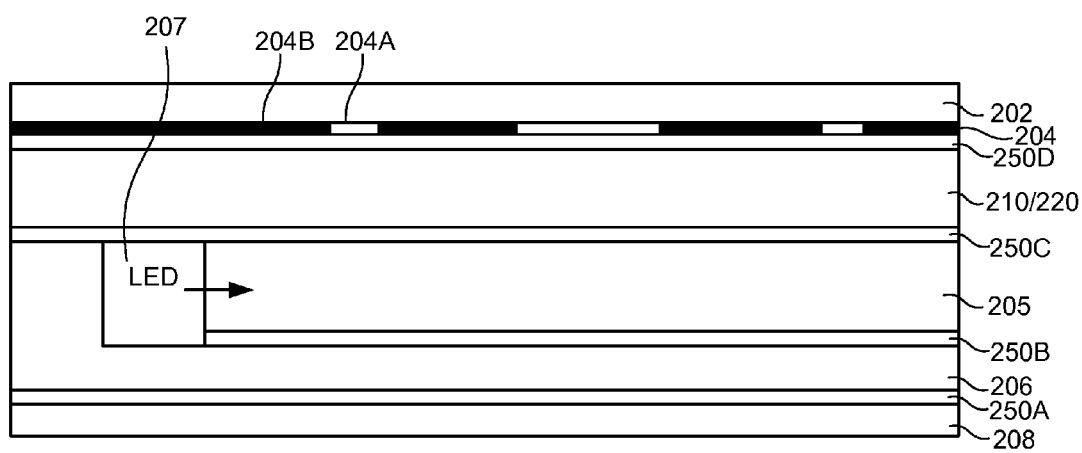

In one example embodiment, as shown in FIG. 2C, a thickness of the substrate 208 may be, for example, approximately 1.00 mm to provide an appropriate level of mechanical strength. The reflector 206 may be, for example, approximately 0.1 mm thick with a reflectivity of greater than or equal to 98%, and attached to the substrate 208 by the optically clear adhesive layer 250a having a thickness of approximately 0.05 mm. The light guide layer 205 may be attached to the reflector 206 by the optically clear adhesive layer 250b having a thickness of approximately 0.025 mm thick with a relatively low refractive index. A refractive index (n) of the optically clear adhesive layers may be less than or equal to 1.58 should work. The light guide layer 205 may be, for example, a polycarbonate material having a refractive index of approximately 1.58.

Figure 2D:
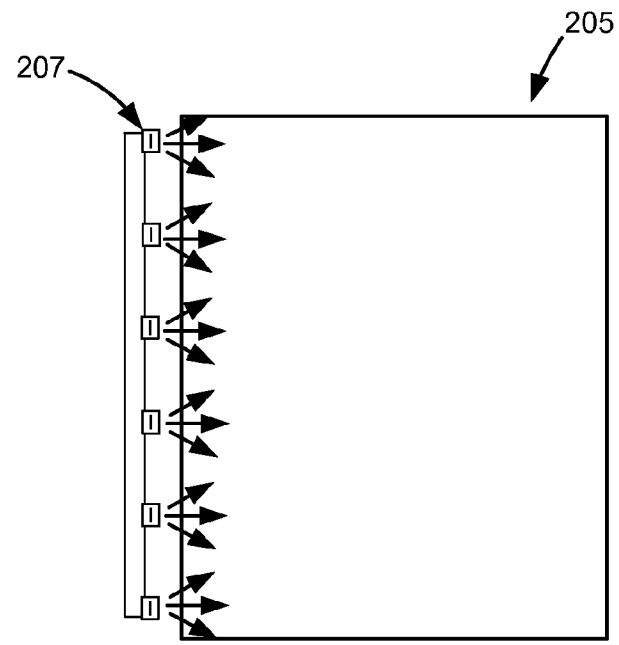
FIG. 2D illustrates examples of a light guide plate and backlight of the touchscreen display devices shown in FIGS. 2A-2C, in accordance with example embodiments.
Figure 2D:
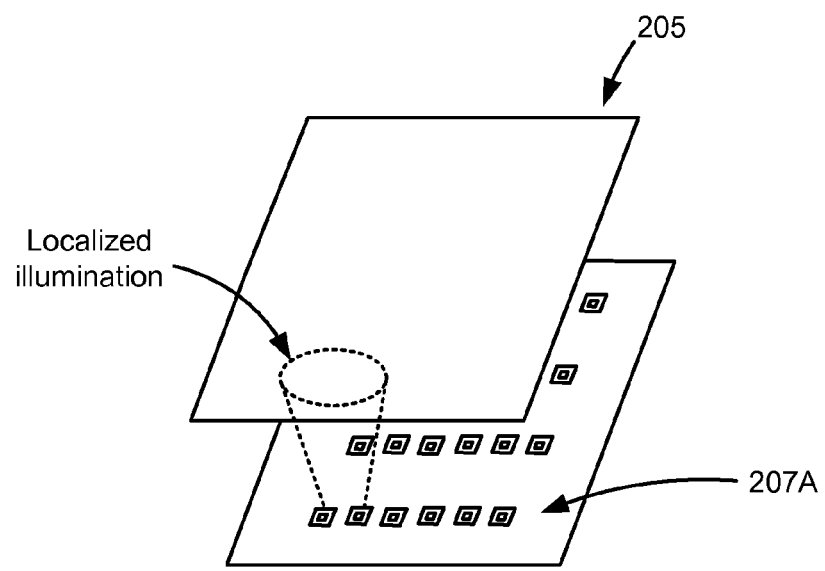

In the example embodiment shown in FIG. 2C, the backlight 207 is disposed along a lateral side of the light guide layer 205. In some embodiments, a backlight 207A may include LEDs, in 2D matrix array, positioned below the light guide layer 205, as shown in FIG. 2D. The light guide layer 205 may have a thickness between approximately 0.2 mm and 0.4 mm, with power efficiency decreasing as thickness decreases, and the backlight 207 may be, for example, an LED or LED array transmitting, for example, approximately 200 nits to 300 nits. The optically clear adhesive layer 250c may attach the light guide layer 205 to a sensor stack including the resistive layer 220 and the capacitive layer 210. A combination of the resistive layer 220 and the capacitive layer 210 may be approximately 0.3 mm thick with a combined transmissivity of approximately 61%. The optically clear adhesive layers 250c and 250d may be approximately 0.05 mm thick with less than approximately 5% haze and greater than approximately 97% transmissivity, and may attach the cover layer 202 to the sensor stack 210/220, with the pattern 204 disposed between the sensor stack 210/220 and the interior facing side surface 202b of the cover layer 202. The cover layer 202 may be approximately 0.15 mm thick with approximately 93% haze and approximately 92% transmissivity. A thickness of the pattern 204 may be approximately 0.01 mm, with approximately 5% transmissivity. The pattern 204 will be described in more detail below, with respect to FIG. 3.

Figure 3:
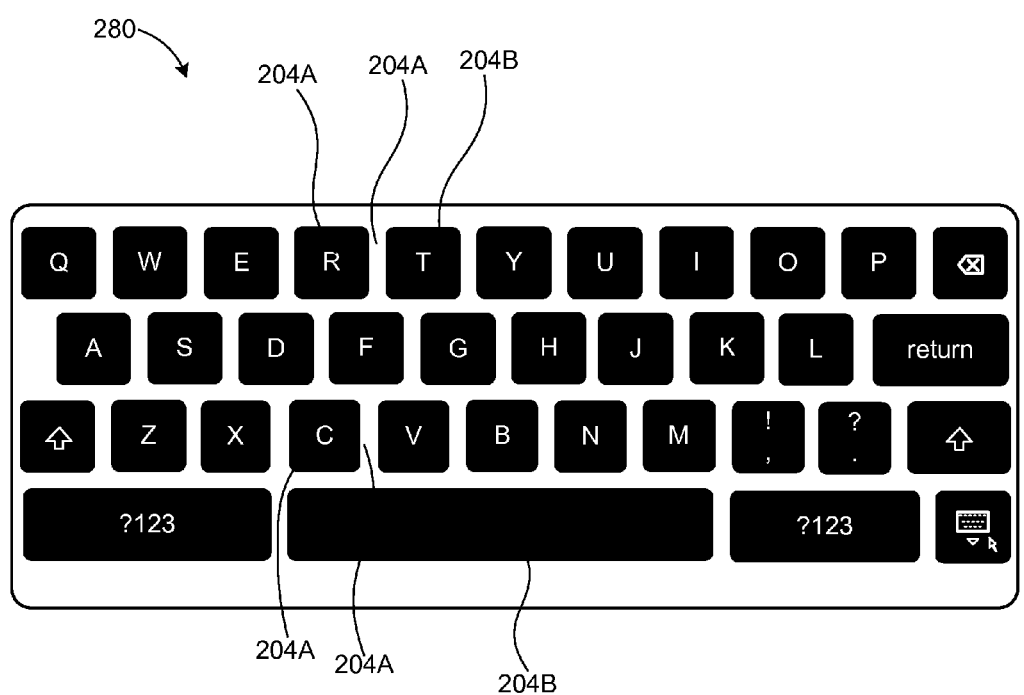
FIG. 3 illustrates a keyboard displayed on a touchscreen display device.

FIG. 3 illustrates a user's view of the pattern 204, through the cover layer 202, when illuminated by the backlight 207, light guide 205 and reflector 206. In the example shown in FIG. 3, the pattern 204 is in the form of a keyboard, and in particular, a soft keyboard, which may be illuminated to facilitate typing on the computing device. However, it is understood that the pattern may take other forms, and is not limited to the keyboard shown in FIG. 3.

As shown in FIG. 3, the pattern 204 may include translucent portions 204a and opaque portions 204b that, in this embodiment, together define a keyboard 280. In the embodiment shown in FIG. 3, the translucent portions 204a and opaque portions 204b are arranged such that, when the backlight 207 is activated, the keyboard 280 is visible to the user through the cover layer 202. The opaque portions 204b may substantially fully block light from being transmitted through the cover layer 202 in the area of the opaque portions 204. To achieve the greatest amount of blocking, the opaque portions 204b may have a transmissivity as close to 0% as possible. A certain amount of light may be transmitted through the translucent portions 204a and to the cover layer 202, defining an outline of keys of the keyboard 280 and features/details on the keys when the backlight 207 is activated and light is transmitted through the translucent portions 204a in the direction of the cover layer 202.

In order to avoid a shadowing effect, or a residual effect, in which a shadow of the outline of the keys of the keyboard 280 is still somewhat visible, even after the backlight 207 has been de-activated and light is no longer transmitted through the translucent portions 204b, the translucent portions 204a are not completely transparent. For example, a transmissivity of the translucent portions 204a of the pattern 204 may be, on average, approximately 5%. This may be considered a relatively low level of transmissivity in this type of application, in which light transmitted through the translucent portions 204a is to define an input feature of the computing device. In order for the pattern 204 of the keyboard 280 to be displayed, even with this relatively low transmissivity level of the translucent portions 204a, an output level of the backlight 207 may be adjusted, so that a sufficient amount of luminance is provided to clearly illuminate the keyboard 280, while the translucent portions 204a retain enough printing material so that the screen goes essentially completely dark and appears essentially completely blank in the area of the pattern 204 when the backlight 207 is de-activated and light is no longer directed toward the cover layer 202. Because the sensor stack 210/220 is essentially transparent and relatively thin, the appropriate level of output to the user can be achieved, even with such low transmissivity through the translucent portions 204a, without excessive requirements for backlight luminance output.

These sample characteristics and properties of the various layers arranged in the exemplary manner shown in FIG. 2C may be used to determine a backlight output level corresponding to a desired visual output to the user of the soft keyboard shown in FIG. 3. For example, if it is determined that 4 to 5 nits is an appropriate light output level to the user to ensure the keyboard is properly visible to the user when the backlight 207 is activated, then an output level of the backlight 207 may be determined based on the characteristics of the various layers of the touchscreen display device 200 and the desired output experienced by the user.

Figure 4A:
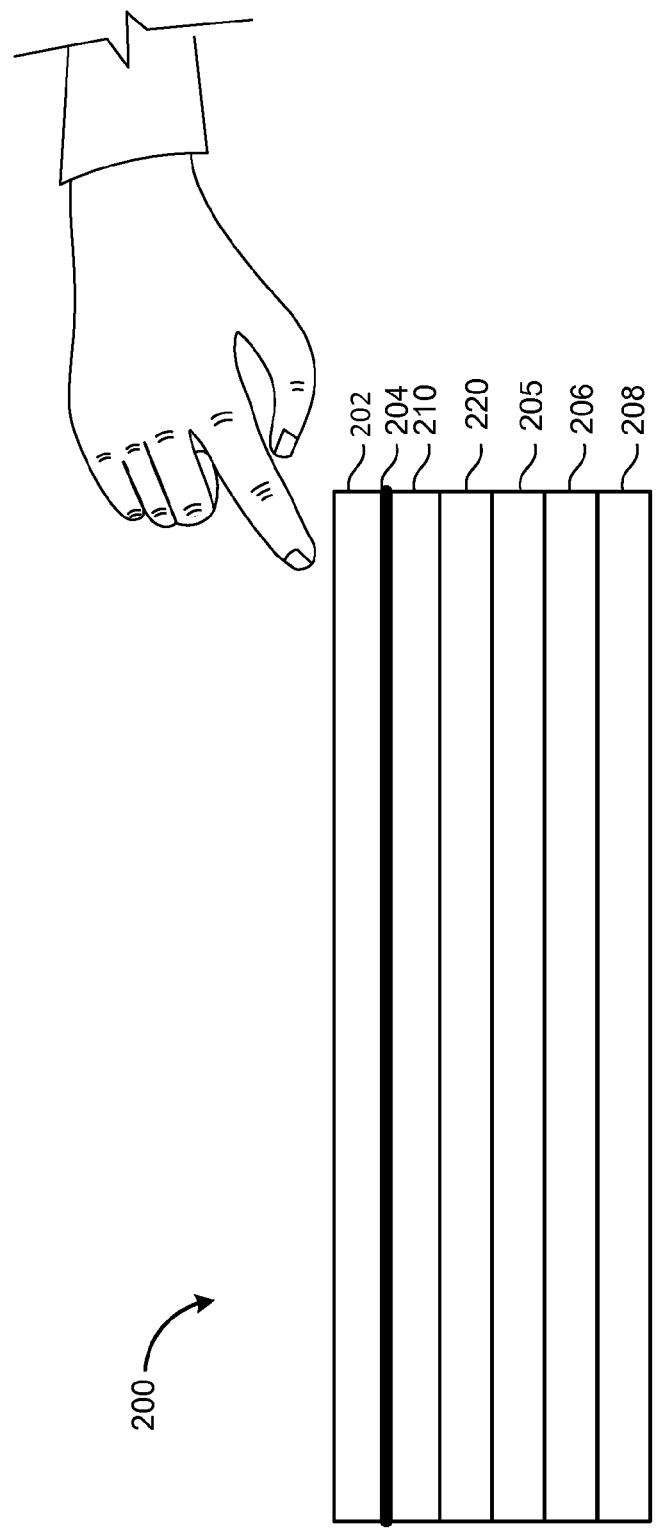
FIG. 4A is a side sectional view of a touchscreen display device in which a user interaction is detected by a capacitive sensor.
Figure 4B:
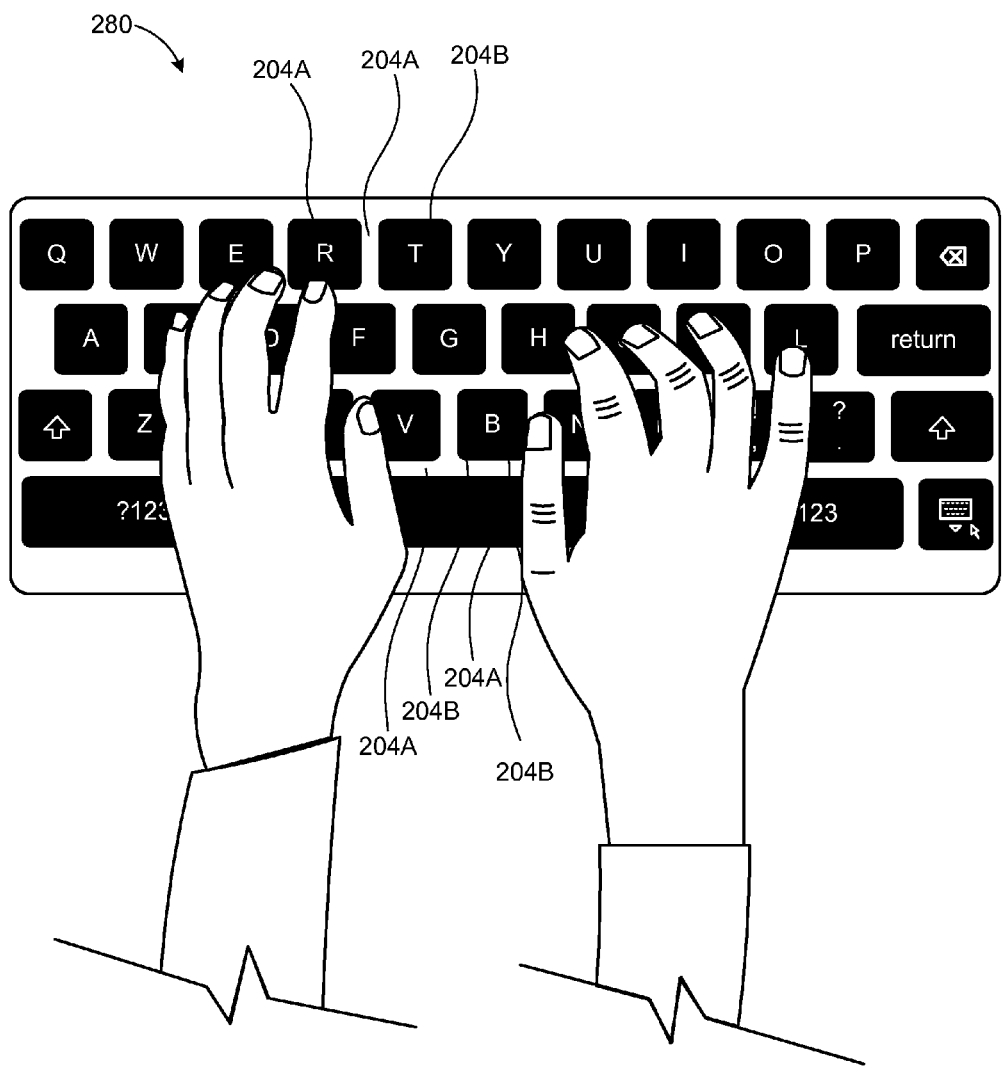
FIG. 4B illustrates a keyboard displayed in response to the user interaction shown in FIG. 4A.
Figure 4C:
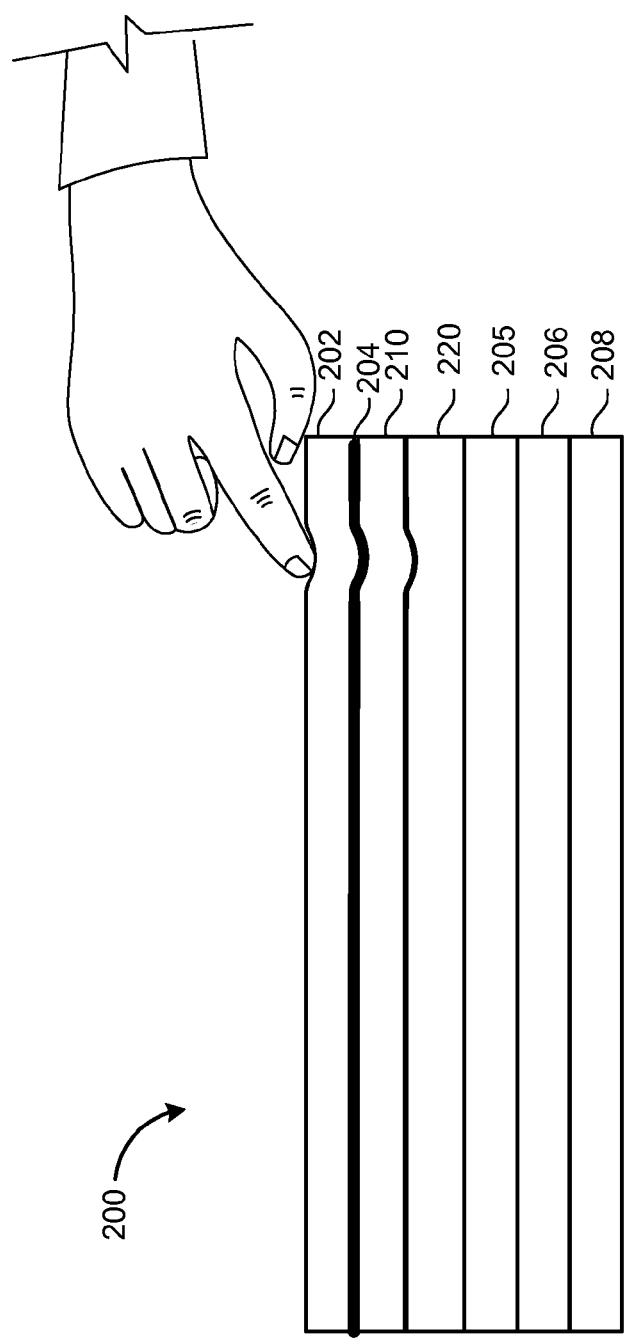
FIG. 4C is a side sectional view of a touchscreen display device in which a user interaction is detected by a resistive sensor.

The user may activate the backlight 207 to illuminate the keyboard 280 in a variety of different ways. In one example mode of operation, as shown in FIG. 4A, a user's finger or hand approaches and/or hovers just above the cover layer 202, in an area corresponding to the pattern 204, and within the detection range, or threshold distance, of the capacitive layer 210. Detection of the finger or hand within the detection range of the capacitive layer 210 in the area corresponding to the pattern 204 activates the backlight 207, and the keyboard 280 is illuminated and is made visible to the user, as shown in FIG. 3. In some embodiments, the backlight 207 may also be activated by a touch directly on the touch sensitive input surface of the cover layer 202 detected by the capacitive layer 210, followed by activation of the backlight 207 and illumination of the keyboard 280 in a similar manner. Once the keyboard 280 is illuminated and visible, the user may apply pressure to the various keys of the keyboard 280 to make key entries, such as text and numerical entries, for example, in the event that a text entry field of a particular application is open to receive this type of entry. As shown in FIG. 4B, the user's hand(s) and finger(s) may be in the at rest position on the keyboard 280, with the fingers resting on, but not applying pressure to, the keyboard 280. As the user applies pressure to individual key(s), with remaining fingers at rest, while typing on the keyboard 280 in a manner typically associated with a traditional mechanical keyboard, the cover layer 202 and capacitive layer 210 in the area of the applied pressure are very slightly depressed and the corresponding pressure/force is transmitted to the resistive layer 220, as shown in FIG. 4C. The resistive layer 220 registers this applied pressure in the specific portion of the resistive layer 220 corresponding to the particular key that was depressed, and the resistive control module 270 may correlate this signal with the appropriate/intended text or numerical entry.

In addition to detection of a hand or finger hover within the detection zone of the capacitive layer 210, in some embodiments, the capacitive layer 210 may detect the presence of the touch implement, such as, for example, a user's finger, as it approaches the touch sensitive surface in the X direction, for example, substantially orthogonal to the touch sensitive surface, and also at various other angles relative to the touch sensitive surface. The capacitive layer 210 may also detect the approach of the user's finger in the X-Y direction, before it may have actually reached the keyboard area, so that the backlight 207 is activated and the keyboard 280 is illuminated by the time the user's finger reaches the keyboard area.

Depending on the position of the backlight 207 relative to the light guide layer 205 and the control mechanism of the backlight 207, in some embodiments, the backlight 207 may illuminate the full surface of the device. In other embodiments, for example, if the backlight 207A is constructed in a 2D matrix array, the backlight 207A may be controlled to selectively illuminate different sections of the device. As noted above, these examples are shown in FIG. 2D.

Entry into this mode of operation may be triggered by the sensing of the capacitive layer 210 which activates the backlight 207 and illuminates/displays the keyboard 280. Entries may be received via pressure applied at the cover layer 202 and transmitted to the resistive layer 220. In this mode, while typing, the user's hand(s) and finger(s) may be in the at rest position on the keyboard 280, without applying pressure, and without triggering an actual input until pressure is deliberately applied to a particular key to be selected. This allows typing to be carried out on the soft keyboard 280 in a manner traditionally associated with a mechanical keyboard at a relatively fast pace and in a less error prone manner than typically associated with a soft keyboard. That is, fingers simply resting on the keys do not register and input, until pressure is applied at an area corresponding to a key.

Due to the very thin cover layer 202/pattern 204 and capacitive layer 210, and the proximity of the resistive layer 220 to the point of application of pressure, or force, at the cover layer 202, the resistive layer 220 may detect an input at a very low target actuation force, with significantly less deflection of the cover layer 202 and capacitive layer 210. The very low actuation force allows typing to be carried out in a manner that facilitates rapid entry of text, even when using a soft keyboard, or virtual keyboard. For example, in one embodiment, an actuation force of less than approximately 10 gram force, and in some embodiments, as low as 5 gram force, may trigger actuation of the backlight 207, causing the keyboard 280 to be illuminated and displayed.

When the keyboard 280 is no longer required, the backlight 207 may be deactivated in a variety of different ways. For example, the backlight 207 may be deactivated in response to a command to deactivate the backlight 207. The command to deactivate the backlight 207 may be entered by the user, either via the keyboard 280, or other entry button or switch of the computing device, or other portion of the touchscreen display device. The command to deactivate the backlight 207 may be generated by the controller 230 after a predetermined amount of time has elapsed from the last keystroke received at the keyboard 280. Other methods of deactivating the backlight 207 may also be appropriate. For example, in the case of a convertible laptop computing device, removal or rearrangement of the moveable hardware keyboard relative to the touchscreen display device may deactivate or activate the backlight 207 and illumination of the keyboard. Upon deactivating the backlight 207, the portion of the screen corresponding to the pattern 204/keyboard 280 may appear completely blank, or change to a uniform color or texture, such as for example, all black, and without any shadowing or residual elements of the keyboard 280 visible to the user. As described above, this shadowing effect may be significantly reduced and/or eliminated by properly controlling the transmissivity of the translucent portions 204a of the pattern 204, balanced with a proper level of luminance output by the backlight 207, transmissivities of the conductive and resistive layers 210 and 220, and the translucent portions 204a of the pattern 204, and thicknesses of the layers, so that the keyboard 280 appears when the backlight 207 is activated in response to detection of the finger/hand within the detection range or zone, or direct touch, detected by the capacitive layer 210, and disappears when the backlight 207 is deactivated.

Operation of a touchscreen display device, in accordance with example embodiments, has been described above with respect to implementation in a tablet type computing device, simply for ease of discussion and illustration. However, a touchscreen display device as embodied and broadly described herein may be applied to other types of computing devices for which a touchscreen display device would provide an appropriate interface for user input.

A touchscreen display device 200, in accordance with embodiments broadly described herein, may be implemented in, for example, the computing device 100 shown in FIG. 5A, in which the touchscreen display device 200 is coupled to a chassis 140 including a keyboard 120 and a pressure-sensitive track pad 130. The touchscreen display device 200 shown in FIG. 5A may be configured to, together with other components of the computing device 100, render a GUI that allows a user to interact with the computing device 100 and make selections from elements displayed on the touchscreen display device 200, and without necessarily making use of the keyboard 120 and/or track pad 130. A user of the computing device 100 may interact with the computing device 100 via the touchscreen display device 200 in the manner described above to display the keyboard 280. In some embodiments, and/or in other modes of operation, a user may directly touch and interact with other portions of the touchscreen display device to, for example, to move a cursor, select objects, launch programs from icons or move objects displayed in the GUI.

A touchscreen display device 200, in accordance with embodiments broadly described herein, may also be implemented in, for example, the example computing device 150 shown in FIG. 5B, which is a tablet device, and is configured without a keyboard in this example. However, it may be understood that this type of tablet device may include a keyboard and/or a pressure sensitive track pad operably connected to the touchscreen display device 200 to further facilitate communication with the computing device 150. A user of the computing device 150 interact with the computing device 150 via the touchscreen display device 200 in the manner described above to display the keyboard 280. That is, in some embodiments, the touchscreen display device 20 may, in addition to the numerous elements rendered by the GUI, may display the virtual keyboard 280 in addition to or instead of the GUI. The user may then interact with the virtual keyboard 280 as described in detail above. Selective display of this soft keyboard 280 on the touchscreen display device 200 of the tablet device as shown in FIG. 1B may eliminate the need for a separate keyboard, rendering the device more portable and enhancing user convenience.

A touchscreen display device 200, in accordance with embodiments broadly described herein, may also be implemented in, for example, the computing device 190 shown in FIG. 5C, which is a smart phone device, and may include the touchscreen display device 200. The touchscreen display device 200 may be configured to, in conjunction with other components of the computing device 190, display the virtual keyboard 280 as described above, and may also render a GUI that allows a user to interact with the computing device 190. A user may interact with the computing device 190 via the touchscreen display device 200 as described in detail above. That is, in some embodiments, the touchscreen display device 200 may, in addition to numerous elements rendered by the GUI, display a soft keyboard 280 as part of or in addition to the GUI. The user may interact with the soft keyboard 280 as described in detail above.

Figure 6:
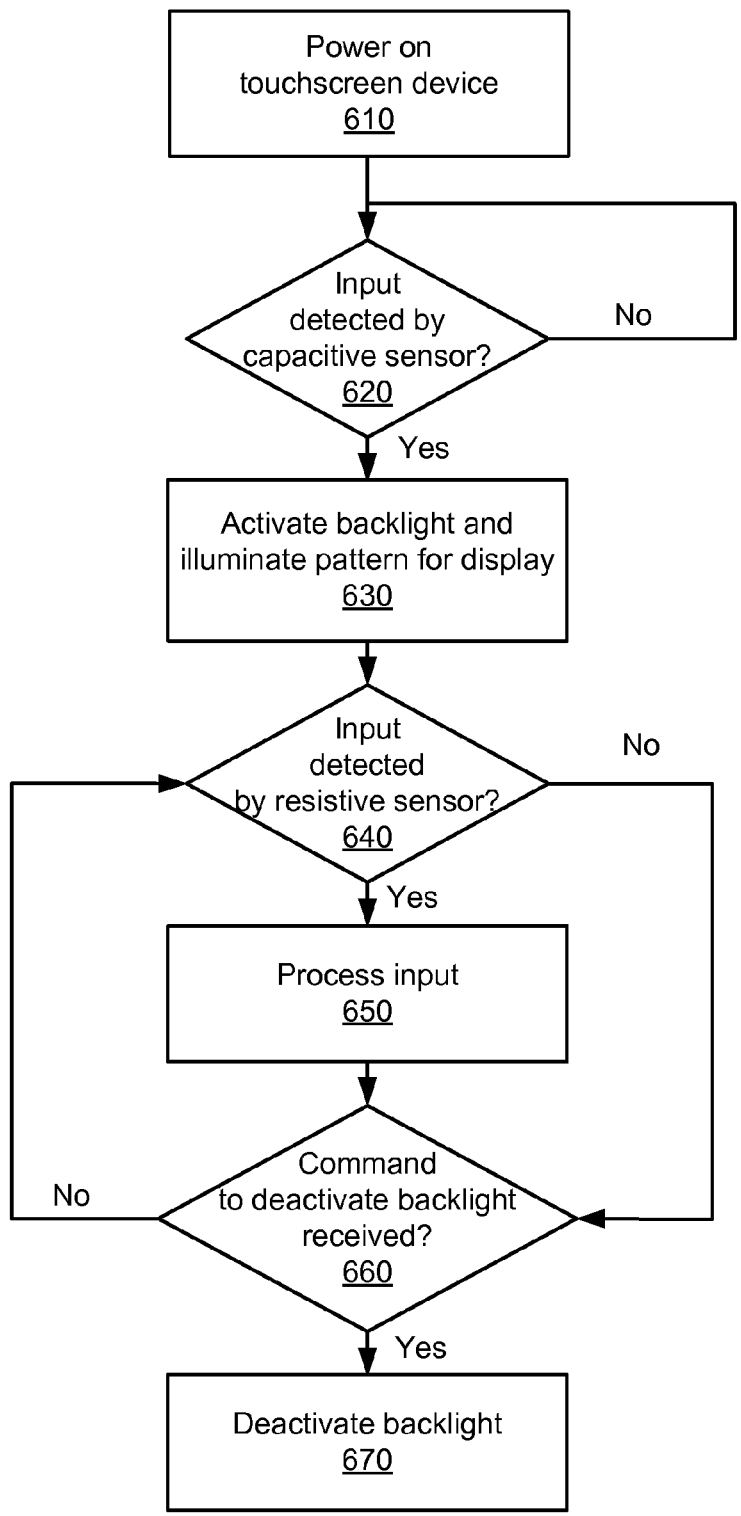
FIGS. 6 and 7 are flowcharts of methods of operating a touchscreen display device, in accordance with embodiments as broadly described herein.

FIG. 6 is a flowchart of a method of operating a touchscreen display device, in accordance with embodiments as broadly described herein. First, at block 610, power is applied to the touchscreen display device 200. If a conductive object, such as a user's finger, is detected by the capacitive layer 210 at block 620, the backlight 207 is activated at block 630. The backlight 207 generates light, which is guided toward the pattern 204 on the cover layer 202 by the light guide layer 205 and the reflector 206, illuminating the pattern 204 so that the pattern 204 is displayed to the user through the cover layer 202. If an input is detected at the resistive layer 220 at block 640, the input is processed at step 650. The input detected by the resistive layer 220 may be a pressure or force applied at the cover layer 202 and exerted in the direction of the resistive layer 220 such that the pressure or force is transferred to the resistive layer 220. The pressure or force is applied at a particular portion of the pattern 204 displayed through the cover layer 202 that the user wishes to select. The pressure or force is transmitted down to a corresponding portion of the resistive layer 220, and a corresponding command is carried out as the input is processed at block 650. The backlight 207 is deactivated at block 670 when it is determined, at block 660, whether a command to deactivate the backlight 207 has been received. This command can be a command input by the user via the touchscreen display device 200, or a command generated by the controller based on, for example, an amount of time that has elapsed since the last user input. Upon deactivating the backlight 207, the pattern 204 is no longer illuminated and displayed to the user through the cover layer 202, and the screen appears to go completely blank, as if the pattern 204 has disappeared.

Figure 7:
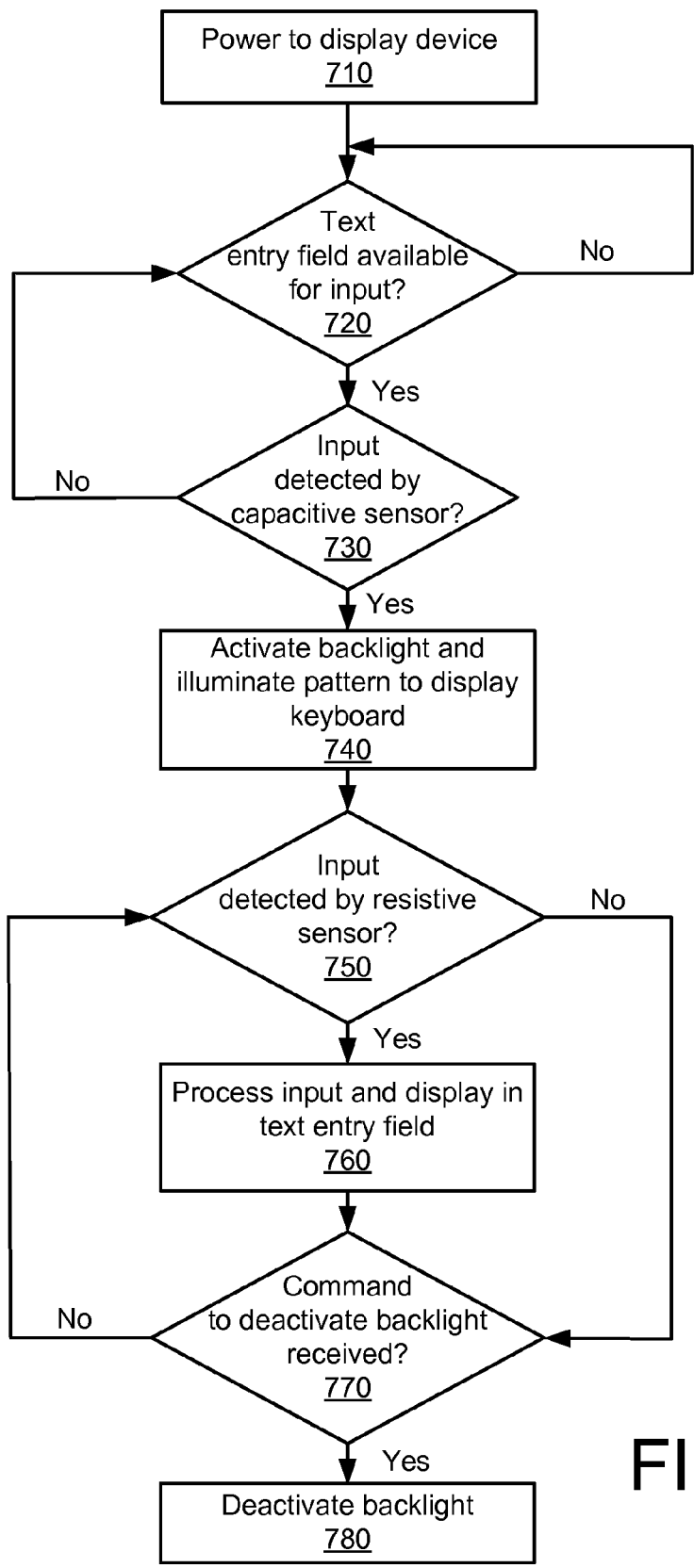

FIG. 7 is a flowchart of another method of operating a touchscreen display device, in accordance with embodiments as broadly described herein, in which the pattern 204 on the cover layer 202 is a keyboard 280 which is displayed to the user as a soft keyboard 280 when the backlight 207 is activated. First, at block 710, power is applied to the touchscreen display device 200. If, at block 710, it is determined that an application is in use on the device in which a text entry field is available for input, and, at block 730, it is determined that a conductive object, such as a user's finger, is detected by the capacitive layer 210, the backlight 207 is activated at block 740. The backlight 207 generates light, which is guided toward the pattern 204 on the cover layer 202 by the light guide layer 205 and the reflector 206, illuminating the pattern 204 so that light is transmitted through the translucent portions 204a and blocked by the opaque portions 204b of the pattern 204, and the keyboard 280 is displayed to the user through the cover layer 202. If, with the keyboard 280 displayed, an input is detected at the resistive layer 220 at block 750, indicating that one of the keys of the keyboard 280 has been pressed, the input is processed and the input text is displayed in the text entry field at block 760. The input detected by the resistive layer 220 may be a pressure or force applied at the cover layer 202 and exerted in the direction of the resistive layer 220 such that the pressure or force is transferred to the resistive layer 220. The pressure or force is applied at a particular portion of the pattern 204, in particular, to one of the keys that the user wishes to select. The pressure or force is transmitted down to a corresponding portion of the resistive layer 220, and a corresponding command to enter the selected key/letter/number in the text entry field is carried out as the input is processed at block 760. The backlight 207 is deactivated at block 780 when it is determined, at block 770, whether a command to deactivate the backlight 207 has been received. This command can be a command input by the user via the touchscreen display device 200, or a command generated by the controller based on, for example, an amount of time that has elapsed since the last user input. Upon deactivating the backlight 207, the keyboard 280 is no longer illuminated and displayed to the user through the cover layer 202, and the screen appears to go completely blank, as if the keyboard 280 has disappeared.

Figure 8:
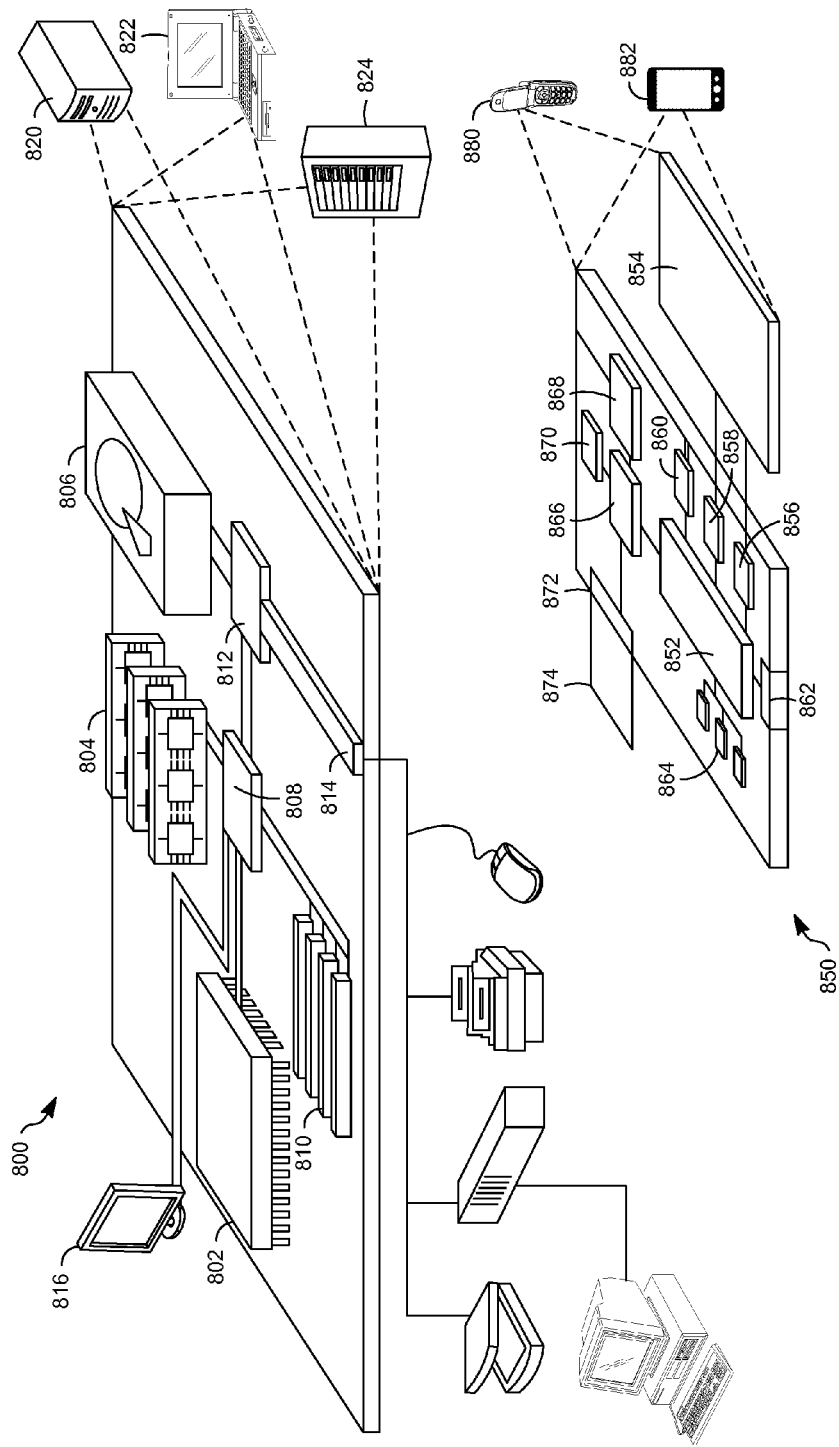
FIG. 8 shows an example of a computer device and a mobile computer device that can be used to implement the techniques described here.

FIG. 8 shows an example of a generic computer device 800 and a generic mobile computer device 880, similar to the computing devices 100, 150 and 190 shown in FIGS. 1A-1C, respectively, illustrating some of the components of the respective computing devices. Computing device 800 is intended to represent various forms of digital computers, such as laptops, desktops, workstations, personal digital assistants, servers, blade servers, mainframes, and other appropriate computers. Computing device 880 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 800 includes a processor 802, memory 804, a storage device 806, a high-speed interface 808 connecting to memory 804 and high-speed expansion ports 810, and a low speed interface 812 connecting to low speed bus 814 and storage device 806. Each of the components 802, 804, 806, 808, 810, and 812, are interconnected using various busses, and may be mounted on a common motherboard or in other manners as appropriate. The processor 802 can process instructions for execution within the computing device 800, including instructions stored in the memory 804 or on the storage device 806 to display graphical information for a GUI on an external input/output device, such as display 816 coupled to high speed interface 808. In other implementations, multiple processors and/or multiple buses may be used, as appropriate, along with multiple memories and types of memory. Also, multiple computing devices 800 may be connected, with each device providing portions of the necessary operations (e.g., as a server bank, a group of blade servers, or a multi-processor system).

The memory 804 stores information within the computing device 800. In one implementation, the memory 804 is a volatile memory unit or units. In another implementation, the memory 804 is a non-volatile memory unit or units. The memory 804 may also be another form of computer-readable medium, such as a magnetic or optical disk.

The storage device 806 is capable of providing mass storage for the computing device 800. In one implementation, the storage device 806 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 804, the storage device 806, or memory on processor 802.

The high speed controller 808 manages bandwidth-intensive operations for the computing device 800, while the low speed controller 812 manages lower bandwidth-intensive operations. Such allocation of functions is exemplary only. In one implementation, the high-speed controller 808 is coupled to memory 804, display 816 (e.g., through a graphics processor or accelerator), and to high-speed expansion ports 810, which may accept various expansion cards (not shown). In the implementation, low-speed controller 812 is coupled to storage device 806 and low-speed expansion port 814. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. It may also be implemented as part of a rack server system 824. In addition, it may be implemented in a personal computer such as a laptop computer 822. Alternatively, components from computing device 800 may be combined with other components in a mobile device (not shown), such as device 880. Each of such devices may contain one or more of computing device 800, 880, and an entire system may be made up of multiple computing devices 800, 880 communicating with each other.

Computing device 880 includes a processor 882, memory 864, an input/output device such as a display 884, a communication interface 866, and a transceiver 868, among other components. The device 880 may also be provided with a storage device, such as a microdrive or other device, to provide additional storage. Each of the components 880, 882, 864, 884, 866, and 868, are interconnected using various buses, and several of the components may be mounted on a common motherboard or in other manners as appropriate.

The processor 882 can execute instructions within the computing device 880, including instructions stored in the memory 864. The processor may be implemented as a chipset of chips that include separate and multiple analog and digital processors. The processor may provide, for example, for coordination of the other components of the device 880, such as control of user interfaces, applications run by device 880, and wireless communication by device 880.

Processor 882 may communicate with a user through control interface 888 and display interface 886 coupled to a display 884. The display 884 may be, for example, a TFT LCD (Thin-Film-Transistor Liquid Crystal Display) or an OLED (Organic Light Emitting Diode) display, or other appropriate display technology. The display interface 886 may comprise appropriate circuitry for driving the display 884 to present graphical and other information to a user. The control interface 888 may receive commands from a user and convert them for submission to the processor 882. For example, the control interface 888 may receive in input entered by a user via, for example, the virtual keyboard 280 displayed by the display 884 including the touchscreen display device 200 described above, and transmit the input to the processor 882 for processing, such as, for entry of corresponding text into a displayed text box. In addition, an external interface 862 may be provide in communication with processor 882, so as to enable near area communication of device 880 with other devices. External interface 862 may provide, for example, for wired communication in some implementations, or for wireless communication in other implementations, and multiple interfaces may also be used.

The memory 864 stores information within the computing device 880. The memory 864 can be implemented as one or more of a computer-readable medium or media, a volatile memory unit or units, or a non-volatile memory unit or units. Expansion memory 874 may also be provided and connected to device 880 through expansion interface 872, which may include, for example, a SIMM (Single In Line Memory Module) card interface. Such expansion memory 874 may provide extra storage space for device 880, or may also store applications or other information for device 880. Specifically, expansion memory 874 may include instructions to carry out or supplement the processes described above, and may include secure information also. Thus, for example, expansion memory 874 may be provide as a security module for device 880, and may be programmed with instructions that permit secure use of device 880. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 864, expansion memory 874, or memory on processor 882, that may be received, for example, over transceiver 868 or external interface 862.

Device 880 may communicate wirelessly through communication interface 866, which may include digital signal processing circuitry where necessary. Communication interface 866 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 868. In addition, short-range communication may occur, such as using a Bluetooth, WiFi, or other such transceiver (not shown). In addition, GPS (Global Positioning System) receiver module 870 may provide additional navigation- and location-related wireless data to device 880, which may be used as appropriate by applications running on device 880.

Device 880 may also communicate audibly using audio codec 860, which may receive spoken information from a user and convert it to usable digital information. Audio codec 860 may likewise generate audible sound for a user, such as through a speaker, e.g., in a handset of device 880. Such sound may include sound from voice telephone calls, may include recorded sound (e.g., voice messages, music files, etc.) and may also include sound generated by applications operating on device 880.

The computing device 880 may be implemented in a number of different forms, as shown in the figure. For example, it may be implemented as a cellular telephone 880. It may also be implemented as part of a smart phone 882, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method of operating a touchscreen device, the method comprising:
    detecting, by a capacitive sensor, a first user interaction with a predetermined portion of a touch surface on an exterior surface of a cover layer, the capacitive sensor being positioned adjacent to an interior surface of the cover layer;
    in response to the first user interaction, activating a backlight and directing light generated by the backlight toward the cover layer;
    detecting, by a resistive sensor positioned below the capacitive sensor, a second user interaction with the touch surface, the second user interaction including an actuation force applied to the touch surface that is sensed by the resistive sensor, and processing an input corresponding to the second user interaction
    wherein the backlight is positioned below the resistive sensor, and wherein activating the backlight and directing light generated by the backlight toward the cover layer includes directing light from the backlight along a light guide layer positioned below the resistive sensor, and through the resistive sensor and the capacitive sensor toward the cover layer such that light generated by the backlight is emitted through translucent portions of a pattern layer provided on the interior surface of the cover layer, and is blocked by opaque portions of the pattern layer; and
    de-activating the backlight such that light is not directed toward the predetermined portion of the touch surface,
    wherein the translucent portions and the opaque portions of the pattern layer define a keyboard at the predetermined portion of the touch surface, and wherein activating a backlight includes transmitting light through the translucent portions of the keyboard such that the keyboard is visible through the cover layer.

2. The method of claim 1, further comprising determining if a current operation mode of the device includes a text entry field, and wherein activating a backlight includes activating a backlight when a text entry field is available for text input, and receiving text input via the keyboard.

3. The method of claim 1, wherein when de-activating the backlight, light is not transmitted through the translucent portions of the pattern layer such that the keyboard is not visible through the cover layer.

4. The method of claim 1, wherein detecting a first user interaction includes detecting a conductive object within a detecting zone of the capacitive sensor positioned below the cover layer.

5. The method of claim 4, wherein detecting a conductive object within a detecting zone of the capacitive sensor includes detecting the conductive object directly on the touch surface or detecting the conductive object within a predetermined distance from the touch surface, the conductive object including a user finger or hand.

6. A touch sensitive display device, comprising:
a cover layer including a touch sensitive surface on an exterior side surface of the cover layer;
a capacitive sensor disposed below an interior side surface of the cover layer;
a resistive sensor disposed below the capacitive sensor;
a pattern layer defined on the interior side surface of the cover layer, between the capacitive sensor and the cover layer;
a backlight;
a light guide layer disposed below the resistive sensor and optically coupled to the backlight; and
a controller configured to control the backlight in response to a user interaction sensed by the at least one sensor at the touch sensitive surface,
wherein the pattern layer includes translucent portions and opaque portions defining a keyboard, the translucent portions transmitting light generated by the backlight through the cover layer, and the opaque portions blocking light generated by the backlight from being transmitted through the cover layer, and wherein the controller is configured to control the backlight to transmit light through the translucent portions of the pattern layer while the opaque portions block light from being transmitted, such that the keyboard is visible at the touch sensitive surface of the cover layer.

7. The device of claim 6, wherein the resistive sensor is configured to detect a touch on the touch surface having an actuation force of less than or equal to 10 gram force.

8. The device of claim 6, the translucent portions having a transmissivity of 5%, and the opaque portions having a transmissivity of 0%.

9. The device of claim 6, wherein a luminance of the backlight is 250 Nits.

10. The device of claim 6, wherein a thickness of the cover layer is 0.15 mm and a transmissivity of the cover layer is 92% with 93% haze.

11. The device of claim 6, wherein the actuation force applied to the touch surface in the second user interaction is less than 15 gram force.

12. The device of claim 6, further comprising:
a reflector positioned below the light guide layer, the light guide layer and reflector guiding light generated by the backlight toward the cover layer.

13. The device of claim 6, wherein the capacitive sensor is configured to detect a conductive pointing object within a detection zone of the capacitive sensor.

14. The device of claim 13, wherein the capacitive sensor is configured to detect a user touch input on the touch sensitive surface of the cover layer, and to activate the backlight in response to the detected user touch input.

15. The device of claim 13, wherein the capacitive sensor is configured to detect a user hand or finger hover within a predetermined distance from the touch sensitive surface of the cover layer, and to activate the backlight in response to the detected hand or finger hover.

16. The device of claim 13, wherein the resistive sensor is configured to detect a touch on the touch surface having an actuation force of between 5 and 10 gram force.

17. The device of claim 6, wherein the pattern layer is printed on the interior side surface of the cover layer, and a thickness of the pattern layer is 0.01 mm, with the translucent portions including 5% transmissive ink and the opaque portions including 0% transmissive ink.

* * * * *